(12) United States Patent
Wang et al.

(10) Patent No.: US 10,707,092 B1
(45) Date of Patent: Jul. 7, 2020

(54) MANUFACTURING METHOD FOR SEMICONDUCTOR PATTERN

(71) Applicant: UNITED MICROELECTRONICS CORP., Hsin-Chu (TW)

(72) Inventors: Chia-Hung Wang, Taichung (TW); En-Chiuan Liou, Tainan (TW); Chien-Hao Chen, Tainan (TW); Jhao-Hao Lee, New Taipei (TW); Sho-Shen Lee, New Taipei (TW); Chih-Yu Chiang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/245,163

(22) Filed: Jan. 10, 2019

(30) Foreign Application Priority Data

Dec. 19, 2018 (CN) .......................... 2018 1 1553322

(51) Int. Cl.
| | | |
|---|---|---|
| *H01L 21/00* | (2006.01) | |
| *H01L 21/311* | (2006.01) | |
| *H01L 21/768* | (2006.01) | |
| *H01L 21/033* | (2006.01) | |
| *H01L 27/108* | (2006.01) | |

(52) U.S. Cl.
CPC .... *H01L 21/31144* (2013.01); *H01L 21/0332* (2013.01); *H01L 21/0337* (2013.01); *H01L 21/76802* (2013.01); *H01L 27/1085* (2013.01)

(58) Field of Classification Search
None
See application file for complete search history.

(56) References Cited

U.S. PATENT DOCUMENTS

| | | | |
|---|---|---|---|
| 9,576,965 B2 | 2/2017 | Yoon | |
| 2006/0131632 A1* | 6/2006 | Chae | ................ H01L 27/10852 257/300 |
| 2012/0034781 A1* | 2/2012 | Kuo | .................. H01L 21/28123 438/694 |
| 2014/0252466 A1* | 9/2014 | Loechelt | ............. H01L 29/7813 257/331 |
| 2017/0053920 A1 | 2/2017 | Kim | |

\* cited by examiner

*Primary Examiner* — Reema Patel
(74) *Attorney, Agent, or Firm* — Winston Hsu

(57) ABSTRACT

The present invention provides a method of fabricating a semiconductor pattern. Firstly, a substrate is provided, having an oxide layer thereon and a first material layer on the oxide layer, a first region and a second region are defined on the substrate. A first etching step is performed, to remove a portion of the first material layer in the first region, and then a plurality of first patterns are formed on the first material layer in the first region. A second composite layer is formed on the first pattern. Next, a second pattern layer is formed on the second composite layer in the first region, and a second etching step is performed, using the first pattern and the second pattern as a mask, to remove a portion of the second composite layer, a portion of the first material layer and a portion of the oxide layer.

15 Claims, 8 Drawing Sheets

MANUFACTURING METHOD FOR SEMICONDUCTOR PATTERN

BACKGROUND OF THE INVENTION

1. Field of the Invention

The present invention generally relates to the field of a method of forming layout definition of a semiconductor device, and more particularly to a method of forming layout definition of a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a method of forming a layout definition of a semiconductor device, in which, a layout design of a semiconductor device is firstly established to imitate the corresponding relationship between each element pattern, followed by forming practical structures on the semiconductor device accordingly. Thus, the method of the present invention enables to form minimized elements with a finer line width and space, so as to avoid possible limits which are subject to optical characteristics during the exposure process.

The present invention provides a method of fabricating a semiconductor pattern. Firstly, a substrate is provided, having an oxide layer thereon and a first material layer on the oxide layer, a first region and a second region are defined on the substrate. A first etching step is performed, to remove a portion of the first material layer in the first region, and then a plurality of first patterns are formed on the first material layer in the first region. A second composite layer is formed on the first pattern. Next, a second pattern layer is formed on the second composite layer in the first region, and a second etching step is performed, using the first pattern and the second pattern as a mask, to remove a portion of the second composite layer, a portion of the first material layer and a portion of the oxide layer.

In summary, the method of forming a layout definition of a semiconductor device of the present invention utilizes a layout design of photomask to establish an opening pattern of a semiconductor device and another opening pattern of a blocking layer respectively, to simultaneously defining a semiconductor structure in a compact, more condensed layout, and to further define a core region and a periphery region of the semiconductor device. In this way, the method of the present invention may have advantages to form an improve semiconductor device such as a dynamic random access memory (DRAM) device under a simplified process flow, for example forming a storage node (SN) of the DRAM device.

The present invention is characterized in that the first pattern and the second pattern are preferably formed only on a material layer in the first region, and it does not be formed in the second region. In the subsequent process step, the pattern (the first pattern and the second pattern) will be transferred into the underlying material layer in the first region, and a mask layer will be formed in the second region. Since the gap fill ability of the photoresist layer is better, it is easy to permeate into the small gap between the patterns and is not easily removed. Therefore, the present invention defines the range of the first region and the second area before the first pattern is formed. In the subsequent process, by adjusting the shape of the patterned photoresist, so as to completely cover the second region, no pattern will be formed in the second region. Thereby, the problem that the photoresist layer is filled in the pattern gap in the second region and is difficult to remove can be avoided, thereby increasing the process yield of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
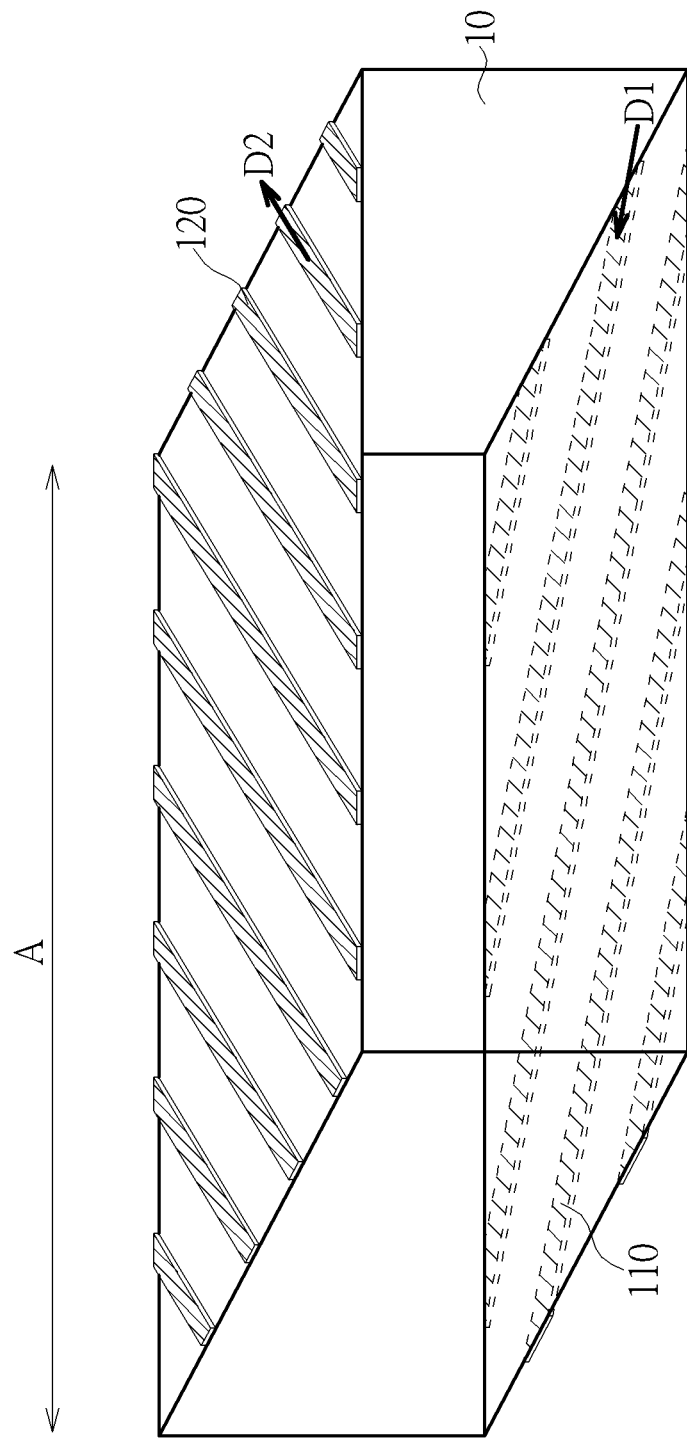
FIG. 1 schematically depicts a three dimensional diagram of line patterns according to an embodiment of the present invention.
Figure 2:
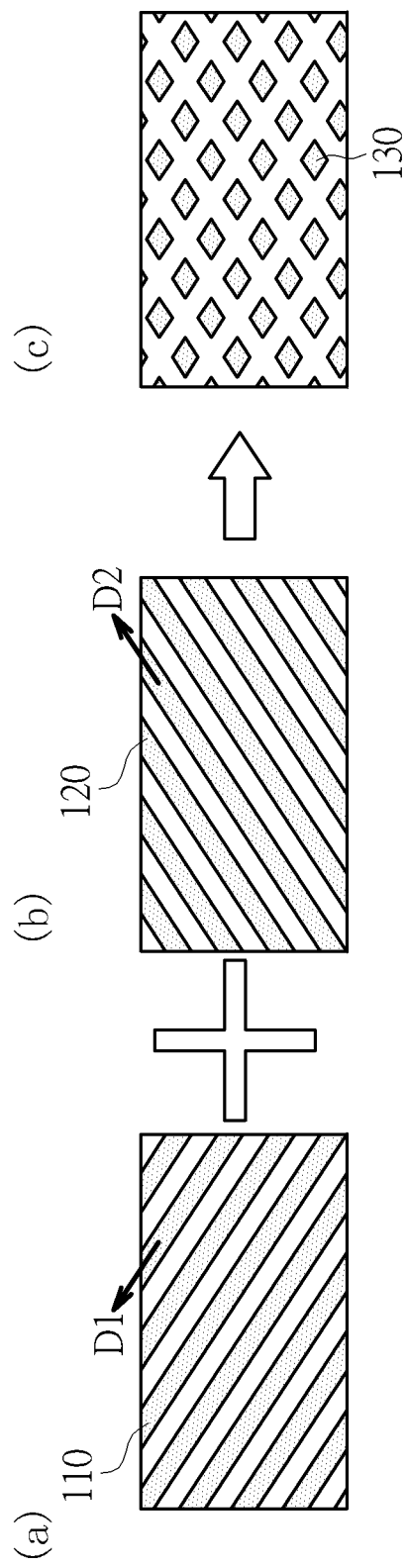
FIG. 2 schematically depicts a top view of line patterns according to an embodiment of the present invention.

FIG. 1 schematically depicts a three dimensional diagram of line patterns according to an embodiment of the present invention. As shown in FIG. 1, a plurality of first line patterns 110 and a plurality of second line patterns 120 are located in different planes, and the first line patterns 110 and the second line patterns 120 are isolated from each other by an insulating layer 10. FIG. 1 only depicts the insulating layer 10 being a single layer, but the insulating layer 10 may be a multilayer in other embodiments. FIG. 1 only depicts a first area A, and the first line patterns 110 extend along a first direction D1 in the first area A, and the second line patterns 120 extend along a second direction D2 in the first area A. Preferably, the first direction D1 and the second direction D2 are not parallel to each other. FIG. 2 schematically depicts a top view of the first line patterns 110 and the second line patterns 120. FIG. 2(a) depicts the first line patterns 110 extend along the first direction D1, and FIG. 2(b) depicts the second line patterns 120 extend along the second direction D2. The first direction D1 is different from the second direction D2, so that the first line patterns 110 and the second line patterns 120 intersect overlapping areas 130. While applying a self-aligned double pattering (SADP) process to form mask patterns in one case, only the material layer right below the overlapping areas 130 intersected by the first line patterns 110 and the second line patterns 120 can be etched. As shown in FIG. 2(c), the overlapping areas 130 have rhombus shape top views, so that rhombus holes can be formed in the material layer right below the first line patterns 110 and the second line patterns 120. In one embodiment, the rhombus holes may be rounded into circular holes after etching the material layer or a stacked material layer below the material layer several times.

Please refer to FIG. 3 and FIG. 4, the steps of forming the first line patterns 110 and the second line patterns 120, and forming patterns below the first line patterns 110 and the second line patterns 120 applying a self-aligned double pattering (SADP) process can be processed as follows, but it is not limited thereto.

Figure 3:
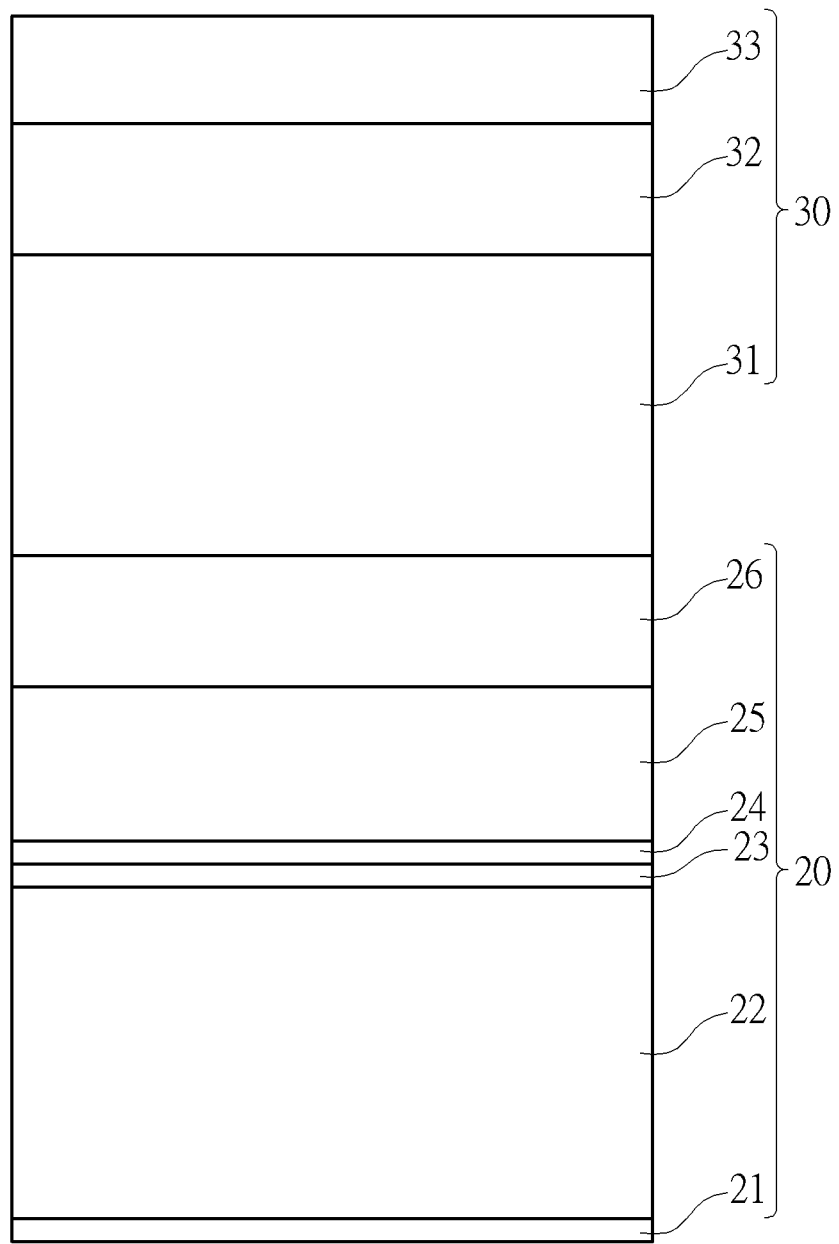
FIG. 3 schematically depicts a cross-sectional view of material layers according to an embodiment of the present invention.

FIG. 3 schematically depicts a cross-sectional view of material layers according to an embodiment of the present invention. In this embodiment, the present invention is applied in patterning a storage node of a capacitor of a dynamic random access memory, and the material layers depicted in FIG. 3 are a hard mask layer used for forming a lower storage node pattern (not shown). As shown in FIG. 3, the material layers below the first line patterns 110 and the second line patterns 120 of FIGS. 1-2 include a nitride layer 21, a borophosphosilicate glass (BPSG) layer 22, an oxide layer 23, a carbon containing nitride layer 24, a plasma enhanced oxide layer 25, a carbon containing nitride layer 26, an amorphous silicon layer 31, an oxide layer 32, an advanced patterning film (APF) 33 formed by an atomic layer deposition (ALD) process from bottom to top. The thickness of the nitride layer 21 is 210 angstroms, the thickness of the borophosphosilicate glass (BPSG) layer 22 is 8000 angstroms, the thickness of the oxide layer 23 is 500 angstroms, the thickness of the carbon containing nitride layer 24 is 350 angstroms, the thickness of the plasma enhanced oxide layer 25 is 5300 angstroms, the thickness of the carbon containing nitride layer 26 is 2700 angstroms, the thickness of the amorphous silicon layer 31 is 7000 angstroms, the thickness of the oxide layer 32 is 2400 angstroms, and the thickness of the advanced patterning film (APF) 33 is 2500 angstroms, but it is not limited thereto.

In this embodiment, the first line patterns 110 and the second line patterns 120 of FIG. 1 are formed on the material layers 20/30 of FIG. 3, and then the patterns of the first line patterns 110 and the second line patterns 120 are transferred into the material layers 20/30. FIG. 4 schematically depicts top views of line patterns in a pattern transferring process according to an embodiment of the present invention. As shown in FIG. 4(a), a plurality of first line patterns 110 of FIG. 2 are formed. Then, as shown in FIG. 4(b), a plurality of first spacer patterns 112 surround the first line patterns 110 and then the first line patterns 110 are removed. As shown in FIG. 4(c), a plurality of second line patterns 120 of FIG. 2 are formed. As shown in FIG. 4(d), a plurality of second spacer patterns 122 surround the second line patterns 120 and then the second line patterns 120 are removed. By doing this, the first spacer patterns 112 and the second spacer patterns 122 formed in different layers and staggered arranged can be formed by the first line patterns 110 and the second line patterns 120, as shown in FIG. 4(e). The overlapping areas 130 intersected by the first spacer patterns 112 and the second spacer patterns 122 are holes, wherein the holes are rhombus holes in this embodiment, but it is not limited thereto.

It is to be noted that the above holes can be used as a storage node contact hole in a semiconductor element. In the conventional step, after the first spacer pattern 112 and the second spacer pattern 122 are completed, a trimming process is performed to define the cell region and the peripheral region of the semiconductor device. For example, the position of the first region A is defined in FIG. 4(e), the first region A is, for example, a cell region, and represents the region where a semiconductor element, such as a storage node, is to be formed in a subsequent step. The region outside the first region A is defined as the second region B, and the second region B is, for example, a peripheral region. In the conventional step, after the first spacer pattern 112 and the second spacer pattern 122 are respectively formed, a photoresist layer is formed in the second region B as a mask layer to cover the second region B. And then an etching step is performed, to transfer the first spacer pattern 112 and the second spacer pattern 122 in the first region A to the underlying material layer, respectively. However, the applicant has found that the above steps may cause a problem, that is, since the gap between the patterns of the first spacer pattern 112 and the second spacer pattern 122 is relatively dense, in the second region B, after the photoresist layer is formed, the photoresist layer may permeate into the small gap between the spacer patterns (the first spacer pattern 112 and the second spacer pattern 122), and it will be difficult to remove the photoresist layer in the subsequent steps, especially near the boundary portion of the first region A and the second region B, it is easy to find the problem that the photoresist layer remains in the gap between the spacer patterns. As a result, it will be detrimental to the yield of the subsequently formed semiconductor structure.

In order to avoid the above problems, please refer to FIG. 5 to FIG. 13, which are schematic cross-sectional views showing a pattern transfer process in a preferred embodiment of the present invention. In order to clearly illustrate the features of the present invention, FIGS. 5-13 illustrate cross-sectional views of the boundary portion regions of the first region A and the second region B. In this case, the material layer 20/30 of FIG. 3 is a hard mask layer, and the hard mask layer is preferably a stacked hard mask layer. In a preferred embodiment, the patterns of the first line patterns 110 and the second line patterns 120 of FIG. 2 are transferred to the material layer 20/30 of FIG. 3 by several processes. For clarifying the present invention, the steps of transferring the patterns of the first line patterns 110 and the second line patterns 120 into the material layer 30 of FIG. 3 are only depicted in FIGS. 5-13, and the steps of transferring the patterns of the material layer 30 into the material layer 20 are well known in the art, and are not described herein.

Figure 5:
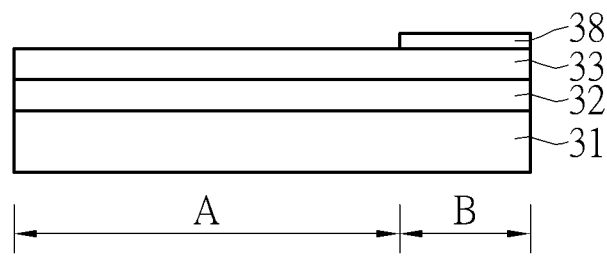
FIGS. 5-17 schematically depict cross-sectional views of a pattern transferring process according to an embodiment of the present invention.
Figure 6:
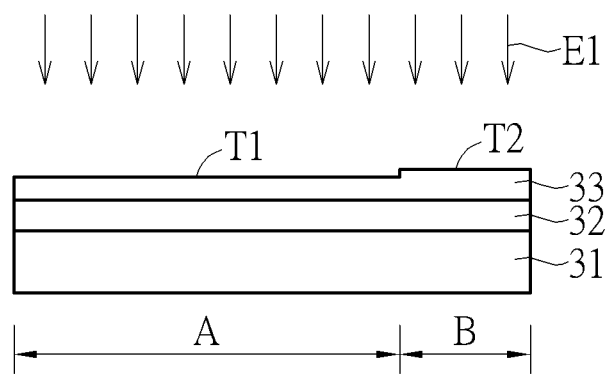

First, FIG. 5 illustrates a method of forming the first line pattern 110 of FIG. 2. As shown in FIG. 5, a patterned photoresist 38 is formed first, covering the material layer 30, especially on the APF 33 in the second region B. At this time, the patterned photoresist 38 is not formed in the first region A. Next, as shown in FIG. 6, an etching step E1 is performed to partially remove the APF 33 in the first region A. At this time, the APF 33 has a stepped cross section. More precisely, a top surface T1 of the APF 33 in the first region A is lower than a top surface T2 of the APF 33 in the second region B.

In the above steps, the thickness of the APF 33 in the first region A is reduced by an etching step, so that the boundary between the first region A and the second region B can be defined in advance by the difference in height of the pattern.

Figure 4:
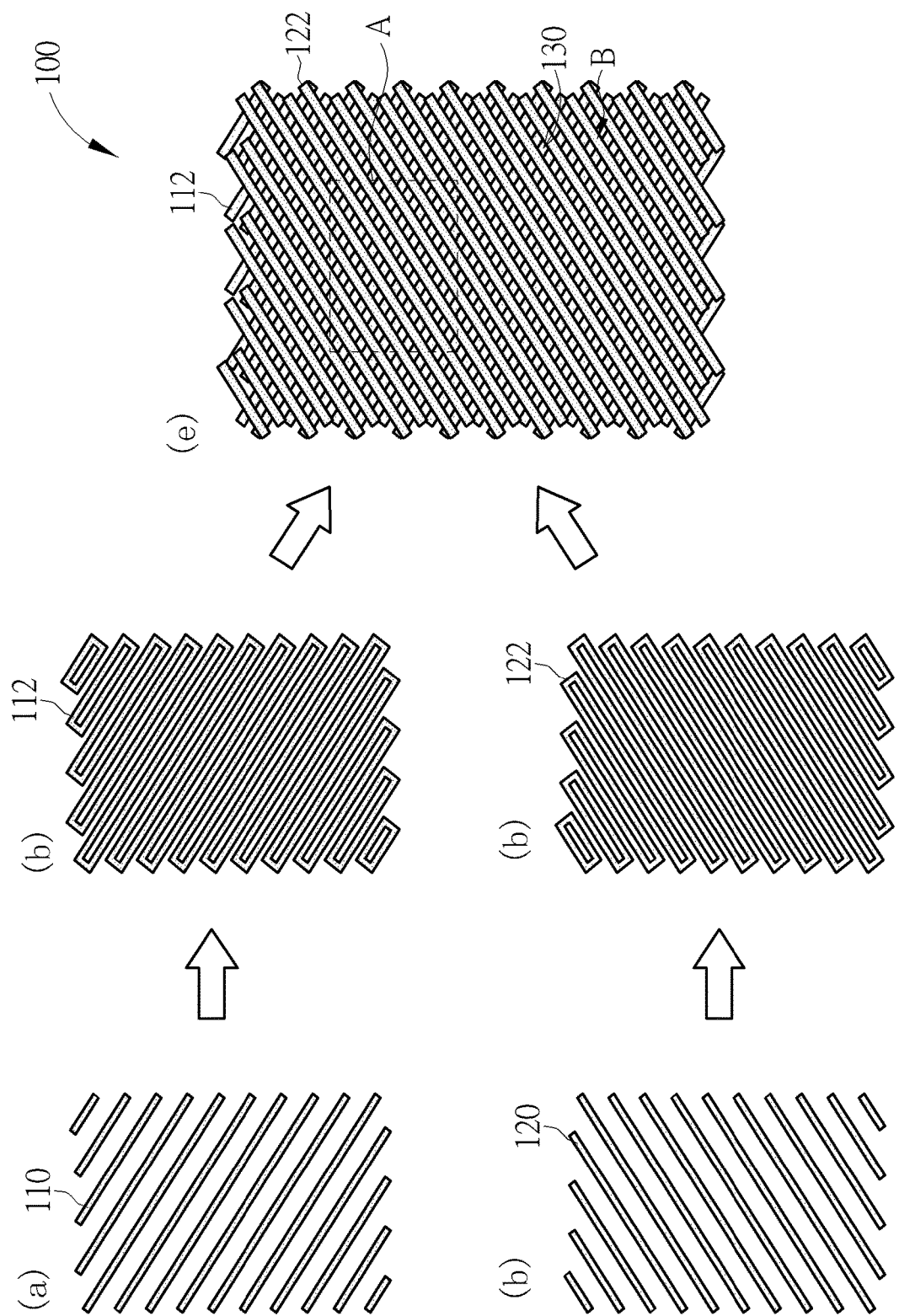
FIG. 4 schematically depicts a top view of line patterns in a pattern transferring process according to an embodiment of the present invention.
Figure 7:
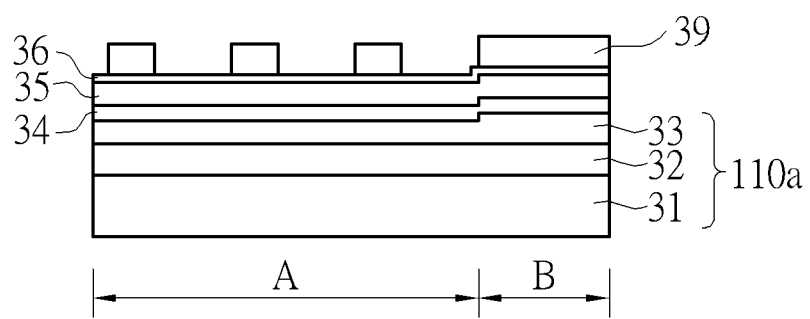
Figure 8:
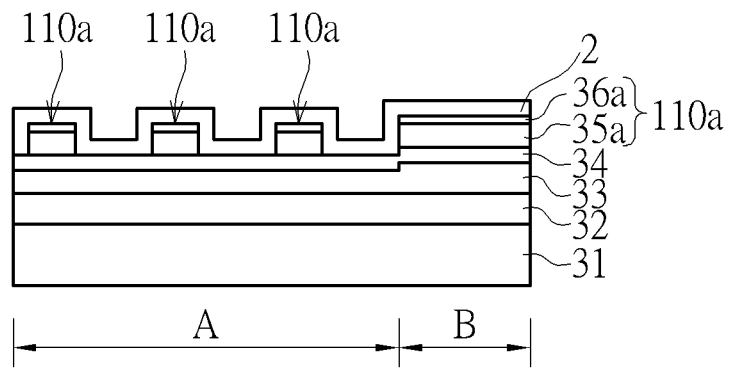
Figure 9:
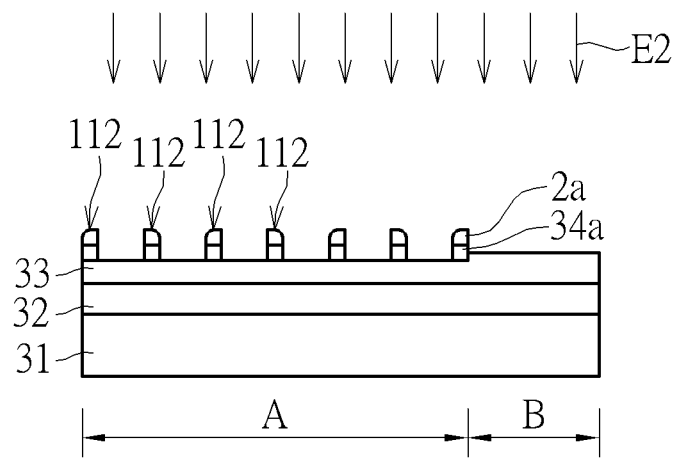

Next, please refer to FIG. 7 to FIG. 9, FIG. 7-9 illustrates a method for forming the first spacer pattern 112 in FIG. 4, which is formed by using a sidewall pattern transfer (SIT) step. A first pattern is formed on the advanced patterning film (APF) 33, and the first pattern here is, for example, the same as the first spacer pattern 112 shown in FIG. 3. The detailed steps are as follows: firstly, as shown in FIG. 7, an oxynitride layer 34, an organic dielectric layer (ODL) 35 and an oxynitride layer 36 are sequentially formed on the advanced patterning film (APF) 33. The thickness of the oxynitride layer 34 is 400 angstroms, the thickness of the organic dielectric layer 35 is 850 angstroms, and the thickness of the oxynitride layer 36 is 200 angstroms, but it is not limited thereto. In addition, a patterned photoresist 39 is formed overlying the oxynitride layer 36. The patterned photoresist 39 here completely covers the second region B.

Next, as shown in FIG. 8, the oxynitride layer 36 and the organic dielectric layer 35 are etched, to form a patterned organic dielectric layer (ODL) 35a and a patterned oxynitride layer 36a on the oxynitride layer 34. Next, a spacer material 2 blanketly covers the patterned organic dielectric layer 35a and the patterned oxynitride layer 36a. It is noted that, in the present embodiment, the patterned organic dielectric layer 35a and the patterned oxynitride layer 36a constitute the above-described FIG. 2 or FIG. 4 of the first line pattern 110a. Then, as shown in FIG. 9, an etching step E2 is performed, to remove parts of the spacer material 2, and to form a spacer 2a and an oxynitride layer 34a surrounding the first line pattern 110a, and then the first line pattern 110a is removed. In the subsequent step, the spacer 2a can be removed, but the oxynitride layer 34a is retained. The oxynitride layer 34a herein may be deemed as a first pattern, for example, the same as the first spacer pattern 112 shown in FIG. 3.

Figure 10:
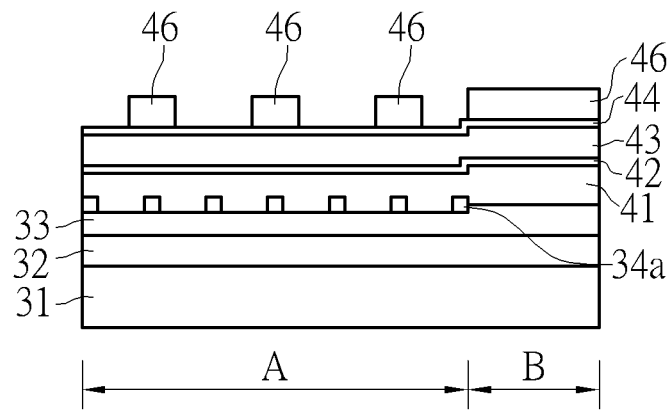
Figure 11:
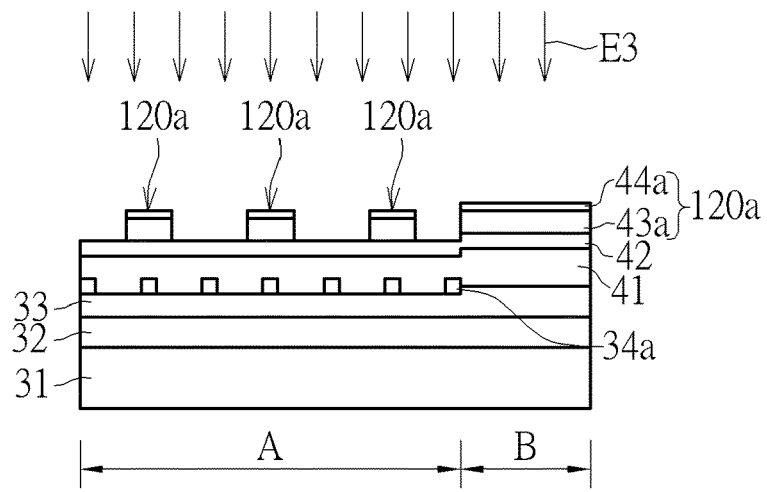
Figure 12:
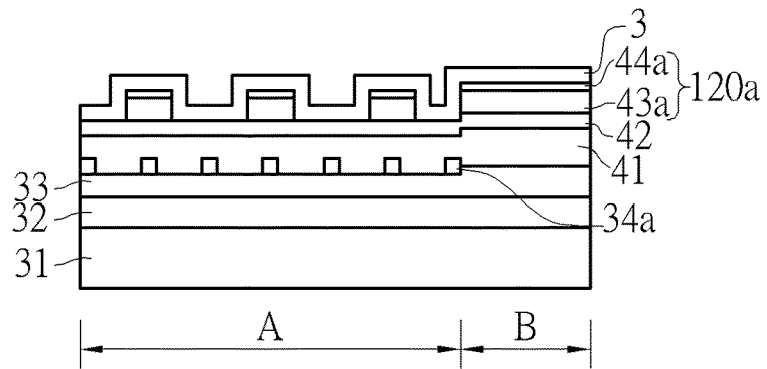
Figure 13:
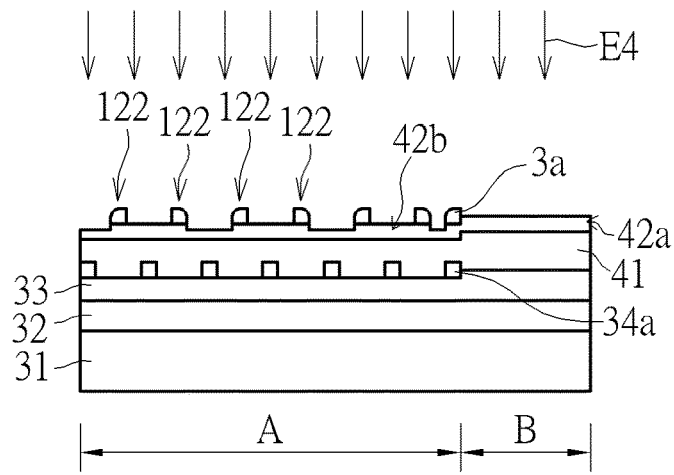

In the following steps, please refer to FIG. 10 to FIG. 13, FIGS. 10-13 illustrate a method for forming the second spacer pattern 122 in FIG. 4, which includes performing a sidewall image transfer (SIT) step. The detailed steps are as follows: as shown in FIG. 10, an organic dielectric layer (ODL) 41, an oxynitride layer 42, an organic dielectric layer (ODL) 43 and an oxynitride layer 44 are formed sequentially to blanketly cover the oxynitride layer 34a and the advanced patterning film (APF) 33. And a patterned photoresist 46 is formed to cover the oxynitride layer 44. Next, as shown in FIG. 11, the oxynitride layer 44 and the organic dielectric layer 43 are etched through an etching step E3, to form a patterned organic dielectric layer 43a and a patterned oxynitride layer 44a on the oxynitride layer 42. In this embodiment, the patterned organic dielectric layer 43a and the patterned oxynitride layer 44a constitute second line patterns 120a. As shown in FIG. 12-FIG. 13, an oxynitride layer 42a and spacers 3a (meaning the second spacer patterns) are formed to surround the second line patterns 120a, and then the second line patterns 120a are removed. More precisely, as shown in FIG. 12, a spacer material 3 blanketly covers the patterned organic dielectric layer 43a and the patterned oxynitride layer 44a (meaning the second line patterns 120a); afterwards, as shown in FIG. 13, the spacer material 3 is etched through an etching step E4, to form the oxynitride layer 42a and the spacers 3a surrounding the second line patterns 120a, and then the second line patterns 120a are removed. In this embodiment, as the spacer material 3 is etched, a part of the oxynitride layer 42 is also etched to form the oxynitride layer 42a, and an oxynitride layer 42b is reserved. The patterned oxynitride layer 44a and the patterned organic dielectric layer 43a are subsequently removed. The spacer 3a (or the underlying oxynitride layer 42a) herein may be deemed as a second pattern, for example, the same as the second spacer pattern 122 shown in FIG. 3.

Figure 14:
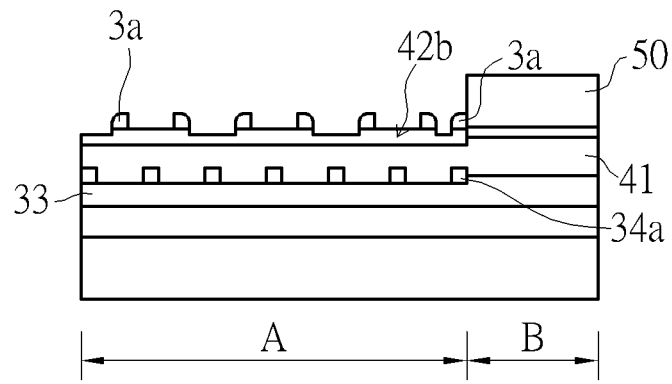
Figure 15:
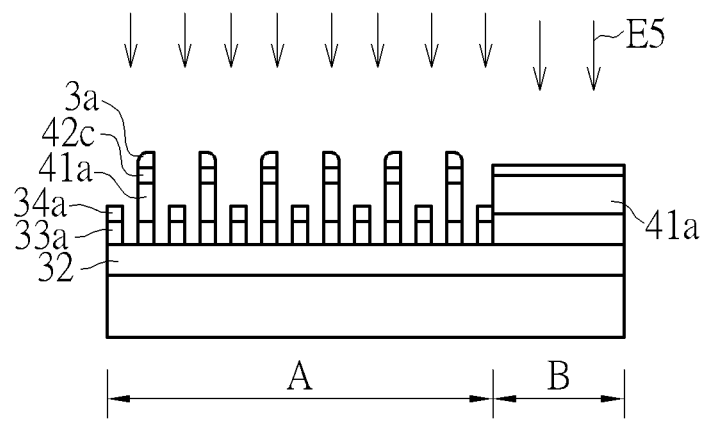

Next, please refer to FIGS. 14-17, as shown in FIG. 14, the spacer 3a may be selectively removed (or in some embodiments, the spacer 3a may also be retained). A patterned photoresist 50 is formed to cover part of the oxynitride layer 34a, parts of the oxynitride layer 42a, and the parts of the spacer 3a. It should be noted that the patterned photoresist 50 formed at this step completely covers the second region B but does not cover the oxynitride layer 42a. Next, an etching process E5 is performed to etch the oxynitride layer 42b, the organic dielectric layer 41 and the advanced patterning film (APF) 33 exposed by the patterned photoresist 50, the oxynitride layer 34a, the oxynitride layer 42a and the spacers 3a. Thereby, an advanced patterning film (APF) 33a, an organic dielectric layer 41a and an oxynitride layer 42c are formed from bottom to top. Thereafter, the patterned photoresist 50 is removed, as shown in FIG. 15.

Figure 16:
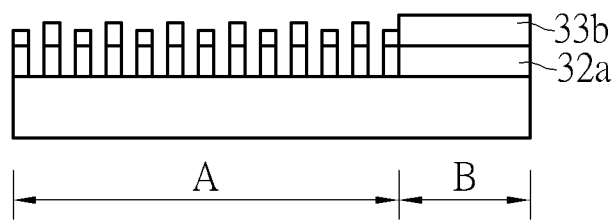
Figure 17:
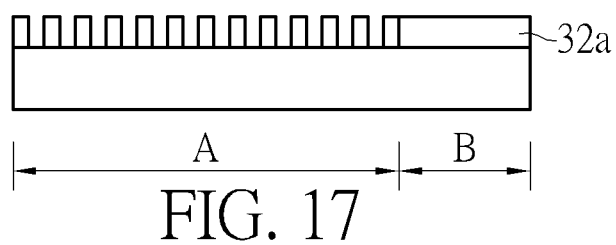

Then, the advanced patterning film (APF) 33a and the oxide layer 32 being exposed are etched to form an advanced patterning film (APF) 33b and an oxide layer 32a with the spacers 3a, the oxynitride layer 42c, the organic dielectric layer 41a and the oxynitride layer 34a being removed completely, as shown in FIG. 16. Thereafter, the advanced patterning film (APF) 33b is removed and the oxide layer 32a is exposed, as shown in FIG. 17. In this way, desired patterns can be formed precisely in the boundary region by applying the method of the present invention. The pattern formed here can be used as a storage node contact hole in a subsequent step.

The present invention is characterized in that the first pattern (i.e., the oxynitride layer 34a) and the second pattern (i.e., the spacer 3a or the oxynitride layer 42a) are preferably formed only on a material layer (the APF 33) in the first region A, and it does not be formed in the second region B. The reason is as described above, in the subsequent process step, the pattern (the first pattern and the second pattern) will be transferred into the underlying material layer in the first region A (as shown in FIGS. 14-17), and a mask layer (e.g., the patterned photoresist 50) will be formed in the second region B. Since the gap fill ability of the photoresist layer is better, it is easy to permeate into the small gap between the patterns and is not easily removed. Therefore, the present invention defines the range of the first region A and the second area B before the first pattern is formed (as shown in FIGS. 5-6). In the subsequent process, by adjusting the shape of the patterned photoresist 39 and the patterned photoresist 46, so as to completely cover the second region B, no pattern will be formed in the second region B. Thereby, the problem that the photoresist layer is filled in the pattern gap in the second region B and is difficult to remove can be avoided, thereby increasing the process yield of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor pattern, comprising:
    providing a substrate, having an oxide layer disposed thereon and a first material layer on the oxide layer, wherein a first region and a second region are defined on the substrate;
    performing a first etching step, to remove a portion of the first material layer in the first region;
    forming a plurality of first patterns on the first material layer in the first region, wherein the first pattern is formed by a first sidewall image transfer (SIT) step;
    forming a second composite layer on the first pattern;
    forming a second pattern layer on the second composite layer in the first region; and
    performing a second etching step, using the first pattern and the second pattern as a mask, to remove a portion of the second composite layer, a portion of the first material layer and a portion of the oxide layer.

2. The method of claim 1, wherein after the first etching step is performed, the first material layer has a stepped cross section, and a top surface in the first region is lower than a top surface in the second region.

3. The method of claim 1, wherein the first material layer comprises an advanced pattern film (APF).

4. The method of claim 1, wherein the first sidewall image transfer (SIT) step comprising:
    forming a first composite layer and a first sacrificial pattern layer on the first material layer;
    forming a first spacer material layer on the first sacrificial pattern layer;
    performing a third etching step to remove a portion of the first spacer material layer;
    removing the first sacrificial pattern layer completely; and
    using the remaining first spacer material layer as a mask, to etch a portion of the first composite layer.

5. The method of claim 1, wherein the second pattern is formed by an another sidewall image transfer (SIT) step.

6. The method of claim 5, wherein the another sidewall image transfer (SIT) step comprising:
    forming a second composite layer and a second sacrificial pattern layer on the first material layer;
    forming a second spacer material layer on the second sacrificial pattern layer;
    performing a fourth etching step to remove a portion of the second spacer material layer;
    removing the second sacrificial pattern layer completely; and
    using the remaining second spacer material layer as a mask, to etch a portion of the second composite layer.

7. The method of claim 1, wherein after the oxide layer is etched, a plurality of the storage node contact holes are formed.

8. The method of claim 1, wherein the first pattern is only located within the first region.

9. The method of claim 1, wherein the second pattern is only located within the first region.

10. The method of claim 4, wherein the first composite layer comprises a silicon oxynitride layer, an organic dielectric layer (organic dielectric layer, ODL) and a silicon oxynitride layer.

11. The method of claim 1, wherein the second composite layer comprises a silicon oxynitride layer, an organic dielectric layer (organic dielectric layer, ODL) and a silicon oxynitride layer.

12. The method of claim 1, wherein the first pattern comprises a plurality of parallel strip structures, arranged along a first direction and parallel to each other.

13. The method of claim 12, wherein the second pattern comprises a plurality of parallel strip structures, arranged along a second direction and parallel to each other, and wherein the second direction is not parallel to the first direction.

14. The method of claim 1, wherein the semiconductor pattern is used as a storage node contact hole in a semiconductor structure.

15. The method of claim 1, wherein a portion of the first pattern and a portion of the second pattern are located above the first material layer.

* * * * *